United States Patent [19]

Hara

[11] Patent Number: 6,087,053
[45] Date of Patent: Jul. 11, 2000

[54] DEVICE MANUFACTURING METHOD WITH TRANSFER MAGNIFICATION ADJUSTMENT TO CORRECT THERMAL DISTORTION OF SUBSTRATE

[75] Inventor: Shinichi Hara, Saitama-ken, Japan

[73] Assignee: Canon Kabushiki Kaisha, Tokyo, Japan

[21] Appl. No.: 09/072,133

[22] Filed: May 5, 1998

[30] Foreign Application Priority Data

May 9, 1997 [JP] Japan ..................................... 9-136080

[51] Int. Cl.[7] ....................................................... G03F 9/00
[52] U.S. Cl. .............................................. 430/30; 430/311
[58] Field of Search ....................................... 430/30, 311

[56] References Cited

U.S. PATENT DOCUMENTS

| | | | |
|---|---|---|---|
| 4,592,081 | 5/1986 | Eaton et al. ............................... | 378/34 |
| 5,184,176 | 2/1993 | Unno et al. ................................ | 355/52 |
| 5,604,779 | 2/1997 | Amemiya et al. ......................... | 378/34 |
| 5,912,096 | 6/1999 | Hada .......................................... | 430/30 |

FOREIGN PATENT DOCUMENTS

| | | |
|---|---|---|
| 61-44429 | 3/1986 | Japan . |
| 7-183214 | 7/1995 | Japan . |
| 9-211872 | 8/1997 | Japan . |

Primary Examiner—Christohper G. Young
Attorney, Agent, or Firm—Fitzpatrick, Cella, Harper & Scinto

[57] ABSTRACT

An exposure method includes the steps of transferring, by exposure, a pattern formed on an original to different shot regions on a substrate sequentially, and performing, during exposure of a certain shot, at least one of (i) adjusting a relative positional relation between the original and the substrate, with respect to a direction effective to correct translation of a transfer region of the substrate due to thermal distortion thereof, and (ii) adjusting a transfer magnification of the pattern of the original to the substrate so as to correct enlargement of the transfer region due to thermal distortion of the substrate. In one preferred form, the adjustment is made in accordance with a correction table related to thermal expansion of the substrate during exposure and being prepared on the basis of one of a calculation and a preparatory exposure experiment. In another preferred form, the transfer magnification is adjusted by deforming the original, and in a further preferred form, the transfer magnification is adjusted by adjusting a projection optical system for projecting the pattern of the original to the substrate.

6 Claims, 10 Drawing Sheets

INTENSITY
DISTRIBUTION
OF EXPOSURE
LIGHT PASSING
THROUGH
ORIGINAL

DISTRIBUTION
OF ENERGY
ABSORBED BY
RESIST

SHOT SIZE BEFORE
SHOT EXPOSURE

SHOT SIZE JUST
AFTER SHOT EXPOSURE p: TRANSLATION
e: MAGNIFICATION CHANGE
(ENLARGEMENT)

W (JUST AFTER SHOT EXPOSURE)

AT START OF EXPOSURE (I)

IN THE MIDDLE OF EXPOSURE (II)

AT THE END OF EXPOSURE (III)

INTEGRATED VALUE IN EXPOSURE TIME (IV)

DEVICE MANUFACTURING METHOD WITH TRANSFER MAGNIFICATION ADJUSTMENT TO CORRECT THERMAL DISTORTION OF SUBSTRATE

FIELD OF THE INVENTION AND RELATED ART

This invention relates to an exposure method and a device manufacturing method for transferring, in an exposure apparatus, a pattern of an original such as a mask to a substrate such as a wafer with high precision.

In accordance with further miniaturization and further enlargement of the density of semiconductor devices due to increasing the degree of integration thereof, regarding the linewidth, a linewidth of 0.25 micron is now required for 256 MDRAM and a linewidth of 0.18 micron is required for 1 GDRAM. Thus, exposure apparatuses for transferring by exposure a pattern of an original such as a reticle or mask to a substrate such as a wafer should have higher and higher precision and better linewidth precision.

Referring to a general structure of a conventional exposure apparatus in conjunction with FIGS. 11A–11C, a light source 1 emits exposure light 2 which goes through an illumination system 3 to illuminate an original 4 on which a mask pattern 4a is formed. The exposure light passing through the original 4 has an intensity distribution (FIG. 11B) corresponding to the mask pattern 4a, such that the energy distribution (FIG. 11C) to be absorbed by a resist 5a on a substrate 5 such as a wafer corresponds to the mask pattern 4a. The resist 5a is then developed to provide a resist image and, subsequently, through a deposition process and an etching process, for example, a circuit pattern in one layer is defined. In this manner, the mask pattern 4a of the original 4 is transferred by exposure to the substrate 5.

As regards the exposure sequence, there is a global alignment method known. An example is disclosed in Japanese Laid-Open Patent Application No. 44429/1986 wherein, prior to exposure of a substrate such as a wafer, positions of alignment marks formed on the substrate are measured and, then, a statistical procedure is performed on the basis of deviations between mark design positions and mark measured positions to determine six parameters, that is, offset (X and Y directions) of the center position of the substrate, expansion/contraction (X and Y directions) of the substrate, rotational amount of the substrate, and perpendicularity of a substrate stage. Then, for exposure of each shot, the substrate stage which holds the substrate is moved in accordance with a designated alignment amount, moving the stage stepwise by a predetermined amount, so as to minimize the registration error between that shot and the original. The sequence of such stepwise motion and exposure is repeated until exposure of the whole substrate is completed. Here, in some cases, after determination of the six parameters on the basis of deviations between the mark design positions and mark measured positions in accordance with the statistical procedure and before execution of the exposure of a first shot, magnification correcting means is used to correct the amount of expansion/contraction (X and Y directions) of the substrate. For example, if the amount of substrate expansion/contraction (X and Y directions) is +5 ppm, a particular lens or lenses of a projection optical system may be shifted in a direction outside the surface, by which only the transfer magnification can be changed by +5 ppm without changing the aberration. After this, as shown in FIGS. 12A and 12B, the procedure of exposure of a shot and stepwise motion of the substrate stage for the next shot is repeated, whereby the exposure process is performed.

The magnification correcting means may be other than the one based on an optical system such as described. Japanese Laid-Open Patent Application, Laid-Open No. 211872/1997 shows a method wherein the size of an original such as a mask or the size of a substrate such as a wafer is directly changed. In relation to scan exposure, U.S. Pat. No. 5,604,779 shows a method wherein an original and a substrate are relatively shifted for magnification correction.

According to investigations made by the inventor, it has been found that, even if an original and a substrate are accurately positioned at their design positions before execution of an exposure of a certain shot, there may be the following problems. That is, during exposure of one shot, the substrate is thermally expanded due to absorption of exposure light. Such thermal expansion of the substrate causes two types of variations, as illustrated in FIGS. 13A–13D, that is, a translation p of the shot center O and an enlargement e about the shot center O. Of FIGS. 13A–13D, FIG. 13A shows by a solid line the size Wo of the shot before execution of exposure of that shot, and FIG. 13B shows the size W of the shot after the exposure. FIG. 13C. shows the translation p of the shot center, and the enlargement (change in magnification) e about the shot center. As a result of such thermal expansion of the substrate, as shown in FIG. 13D, there occurs a change in the absorbed exposure energy profile of a resist on the substrate (the relation between the position on the resist and the absorbed exposure energy), during the exposure period of one shot. This causes a slow down of an integrated absorbed exposure energy profile during the exposure period, and it deteriorates the linewidth precision.

In conventional exposure apparatuses such as described, before shot exposure, the magnification of a substrate is calculated on the basis of the result as attainable in accordance with the global alignment method. Then, an original or an optical system is shifted in a direction outside the surface or is deformed in a direction along the surface, by use of magnification correcting means, to change the size of the original or the optical system thereby to change the magnification so that it is fitted to the magnification of the substrate. Then, the shot exposure starts. However, since there is no measure with respect to thermal deformation of the substrate during exposure of one shot due to absorption of exposure light by the substrate, the transfer linewidth precision is degraded.

Further, as regards thermal distortion during scan exposure, the amount of movement of a mask pattern of an original, which is exposed simultaneously, varies with the position. It is, therefore, not possible to accomplish complete registration between the pattern of the original and the pattern of the substrate during the exposure, with respect to the whole of the pattern to be exposed simultaneously, merely by relatively moving the original and the substrate. Thus, the linewidth precision degrades, depending on the position.

SUMMARY OF THE INVENTION

It is an object of the present invention to provide an exposure method and/or an exposure apparatus by which degradation of linewidth precision due to thermal expansion of a substrate such as a wafer during exposure thereof can be reduced.

It is another object of the present invention to provide a device manufacturing method by which high precision devices can be produced with good efficiency.

Briefly, the present invention has been made on the basis of the finding that; thermal distortion during the exposure process mainly comprises enlargement about the center of a shot; the rate of enlargement is approximately uniform; and by correcting at least one of, preferably both of, translation of the shot center of the substrate and enlargement about the shot center during the exposure process, degradation of linewidth precision can be reduced.

In accordance with an aspect of the present invention, there is provided an exposure method, comprising the steps of: transferring, by exposure, a pattern formed on an original to different shot regions on a substrate sequentially; and performing, during exposure of a certain shot, at least one of (i) adjusting the relative positional relation between the original and the substrate, with respect to a direction effective to correct translation of a transfer region of the substrate due to thermal distortion thereof, and (ii) adjusting a transfer magnification of the pattern of the original to the substrate so as to correct enlargement of the transfer region due to thermal distortion of the substrate.

In accordance with another aspect of the present invention, there is provided a device manufacturing method, comprising the steps of: preparing a substrate; applying a resist to the substrate prior to exposure thereof; transferring, by exposure, a pattern of an original to the substrate in accordance with an exposure method as recited above; and developing the resist of the substrate after the exposure.

In accordance with a further aspect of the present invention, there is provided an exposure apparatus for transferring a pattern formed on an original to different shot regions of a substrate sequentially, said apparatus comprising: a first holding mechanism for holding the original; a second holding mechanism for holding the substrate; a moving mechanism for relatively and minutely moving the original and the substrate held by said first and second holding mechanisms, relative to each other; a magnification adjusting mechanism for providing variable transfer magnification in relation to transfer of the pattern of the original to the substrate; and control means for actuating said moving mechanism and said magnification adjusting mechanism during exposure of a shot.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 4A and 4B are schematic views, respectively, showing a magnification correcting mechanism disposed on a bottom side of an original chuck base in the exposure apparatus, wherein FIG. 4B is a sectional view taken on line A—A in FIG. 4A.

FIGS. 11A–11C are schematic views, respectively, wherein FIG. 11A shows a general structure of a conventional exposure apparatus, FIG. 11B shows an intensity distribution of exposure light passed through an original, and FIG. 11C shows distribution of energies absorbed by a resist.

FIGS. 12A and 12B are schematic views, respectively, wherein FIG. 12A shows a general structure of a conventional exposure apparatus, and FIG. 12B shows an example of a step-and-repeat exposure process.

FIGS. 13A–13D are schematic views, respectively, for explaining thermal expansion of a substrate during exposure of a shot due to absorption of exposure light, wherein FIGS. 13A and 13B show the size of a shot before and just after the shot exposure, respectively, wherein FIG. 13C shows a translation p of the center O of the shot and an enlargement (magnification change) e about the shot center O, and wherein FIG. 13D shows changes in an absorbed exposure energy profile of a resist on the substrate during the exposure period (i.e., the relation between the position on the resist and the absorbed exposure energy).

DESCRIPTION OF THE PREFERRED EMBODIMENTS

First Embodiment

Figure 1:
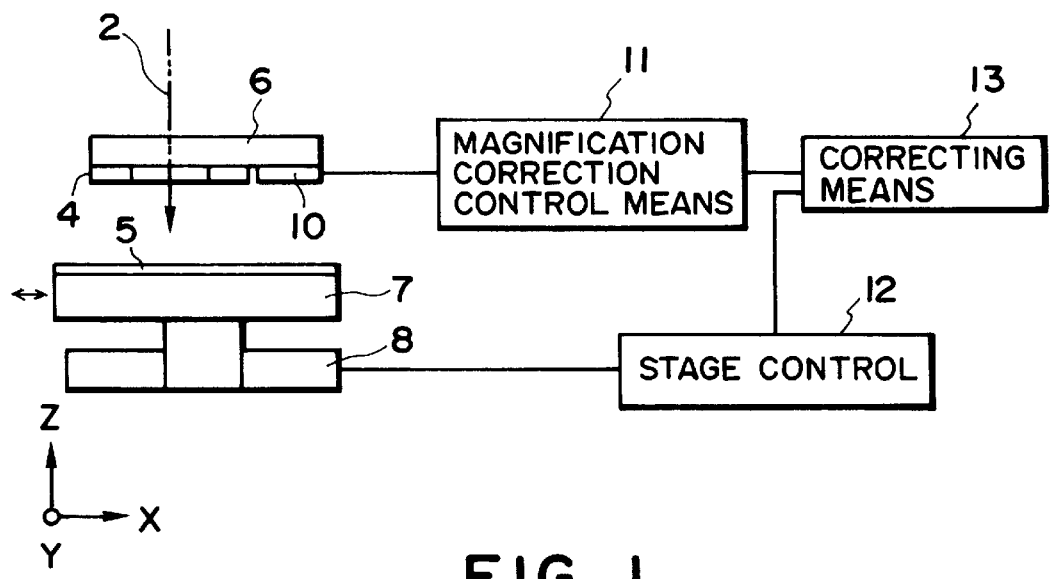
FIG. 1 is a schematic and diagrammatic view of an exposure apparatus, which best shows features of an exposure method according to the present invention.

FIG. 1 is a schematic and diagrammatic view of an exposure apparatus which best shows features of an exposure method according to the present invention. Through exposure experiments or calculation, deformation which will be produced in a substrate 5 such as a wafer, for example, during exposure of one shot due to thermal expansion of the substrate is determined beforehand. On the basis of the thus determined data, a correction table for cancelling deformation of the substrate 5 is prepared, and a substrate stage 8 for holding the substrate 5 is moved in a direction along the surface thereof. Then, an external force is applied to an original 4 such as a mask, for example, to change the magnification of the original 4. Correction data for the magnification correction is stored in the correction table. Correcting means 13 has this correction table and, by using this correcting means 13, the stage 8 is moved in a direction along the surface by means of a stage controller 12 during the shot exposure, so that a translation of the shot center of the substrate 5 due to thermal expansion during the exposure is canceled. Also, a magnification correction controller 11 operates during the shot exposure to actuate a transfer magnification correcting mechanism 10 to apply an external force to the original 4, by which the magnification of the original 4 is changed and by which an enlargement of the substrate about the shot center is canceled.

Figure 2:
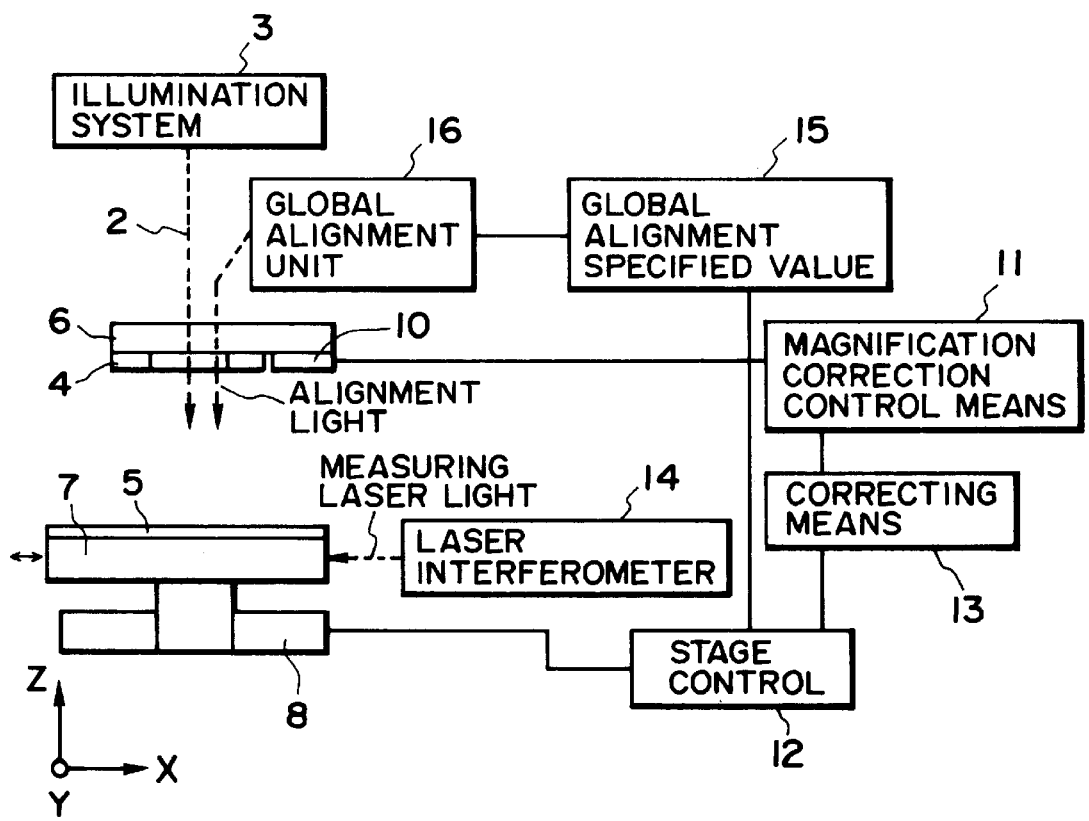
FIG. 2 is a schematic and diagrammatic view, for explaining the structure related to a stage control system of an exposure apparatus to which an exposure method according to the present invention is applied.

The general structure of the present invention will be described with reference to FIGS. 1 and 2.

An original 4 such as a mask, for example, having a pattern formed thereon is fixedly held by an original chuck 6. Also, a substrate 5 such as a wafer, for example, is held by a substrate chuck 7 by attraction. The substrate chuck 7 is mounted on a substrate stage 8 which is movable in X and Y directions. Exposure light 2 emitted from a light source comprises X-rays, ultraviolet rays or visible light, and it passes through an illumination system 3 and illuminates the original 4. By this, the pattern formed on the original 4 is transferred, by exposure, onto the substrate 5. The magnification correcting mechanism 10 for correcting magnification of the original 4 by applying an external force to the original 4 is actuated in response to an output signal from the magnification correction controller 11. The substrate stage 8 for moving the substrate 5 to a desired position is actuated in response to an output signal of a stage controller 12. The position, movement speed and acceleration of the substrate 5 are controlled by means of the stage controller 12. The magnification correction controller 11 and stage controller 12 are arranged to actuate the magnification correcting mechanism 11 and the substrate stage 8 during exposure of one shot, in accordance with a specified value based on the correction table of the correcting means 13. Details of the correction table of the correcting means will be described later.

Referring to the stage controller 12, in conventional exposure apparatuses wherein exposure light 2 is projected over the whole exposure picture angle by an illumination system 3 to execute simultaneous exposure thereof, such as disclosed in Japanese Laid-Open Patent Application, Laid-Open No. 100311/1990, during exposure of one shot, a stage controller 12 so controls that, relative to an original 4 held fixed on an original chuck 6, a substrate chuck 7 is held stationary at a fixed position with respect to a certain reference. For this reason, a laser interferometer 14 is used to measure the position of the substrate chuck 7 with respect to the reference, and positioning thereof is performed. After completion of exposure of one shot, the stage controller 12 moves the substrate stage 8 stepwise in accordance with a global alignment specified value as produced by a global alignment unit 16, and the subsequent shot is exposed in a similar manner. Thus, with the conventional stage controller 12, during exposure of one shot, the substrate chuck 7 is kept stationary relative to the fixed original 4, at a certain position with respect to the reference.

Figure 13A:
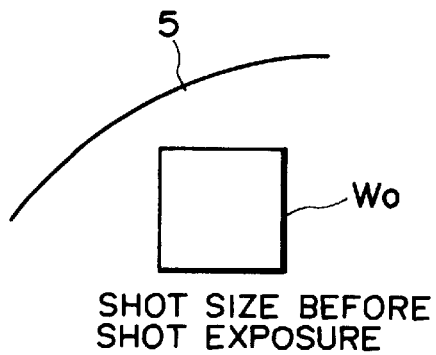
Figure 13B:
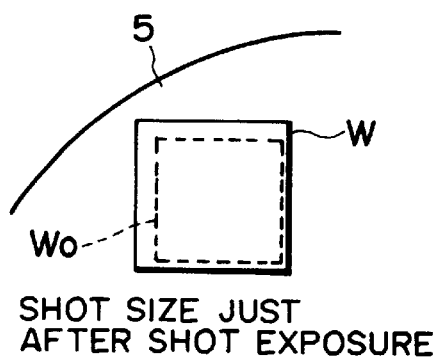
Figure 13C:
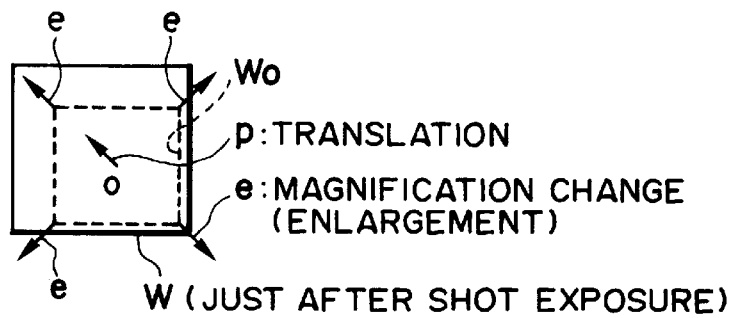
Figure 13D:
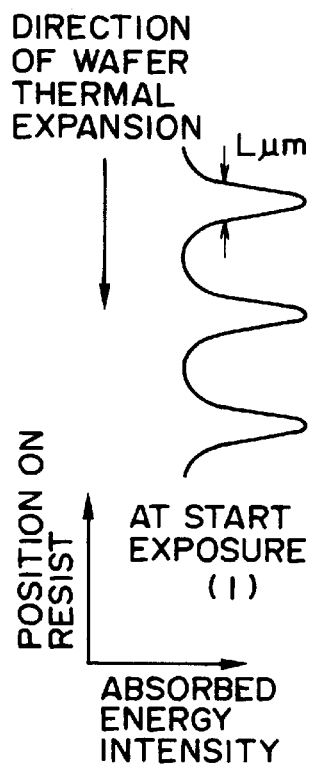

As compared therewith, the stage controller 12 of the present invention controls so that, during exposure of one shot and relative to the original 4 held fixed, the distance of the substrate chuck 7 with respect to a reference is changed in accordance with the correction table of the correcting means 13. For example, it operates to move the chuck so that a translation p of the shot center O of the substrate 5 (FIG. 13C) is canceled. With such movement, the amount of translation of the shot center O of the substrate, in the X and Y directions, produced by thermal expansion of the substrate 5 during exposure of one shot, can be reduced approximately to zero.

Figure 3:
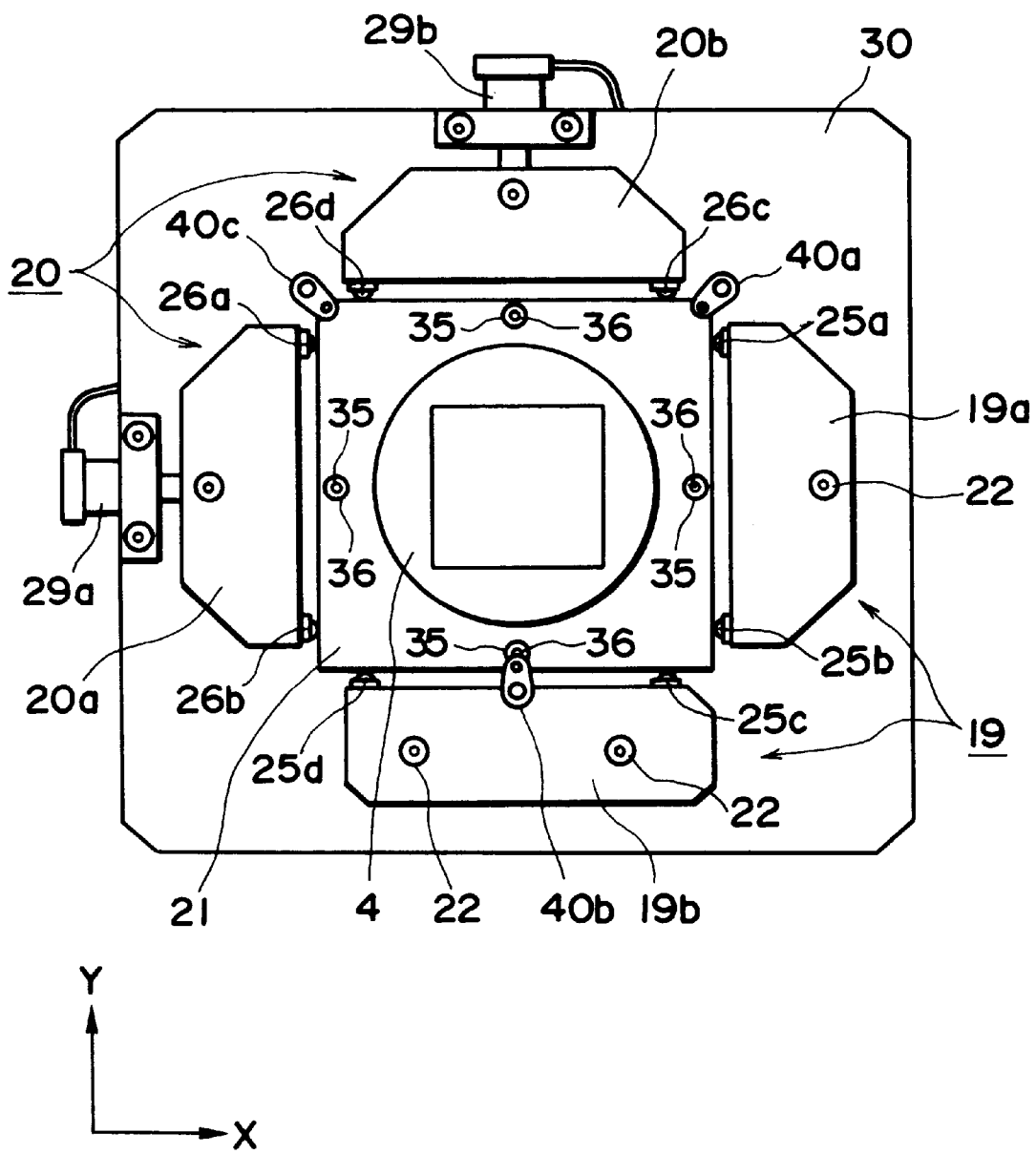
FIG. 3 is a schematic and plan view of a chuck for an original, in the exposure apparatus.

Next, details of the structure of the original chuck 6 will be described, with reference to FIG. 3.

Original frame 21 holds an original 4 having a pattern formed on its membrane. Positioning the original frame 21 with respect to X and Y directions is performed by supporting means 19 which is mounted on one side of an original chuck base 30 and pressing means 20 which includes a pressing member 29 such as an air cylinder, for example. Positioning of the frame with respect to the Z direction is performed by Z clamping means (40a, 40b and 40c). The supporting means 19 includes an X-direction supporting member 19a which is mounted on the original chuck base 30 by a single bolt 22, for fine motion about the Z axis, and which supports supporting pins 25a and 25b of hemispherical rigid balls for engaging with a side edge of the original frame 21 for positioning the same with respect to the X direction. The supporting means 19 further includes a Y-direction supporting member 19b which is fixedly mounted on the original chuck base 30 by two bolts 22 and which supports supporting pins 25c and 25d for engaging with another side edge of the original frame 21 for positioning the same with respect to the Y direction. On the other hand, pressing means 20 includes an X-direction pressing member 20a which can be driven by a pressurizing member 29a such as an air cylinder, for example, mounted on the original chuck base 30, and which supports hemispherical pressing pins 26a and 26b for pressing a side edge of the original frame 21 in the X direction. The pressing means 20 further includes a Y-direction pressing member 20b which can be similarly driven by a pressurizing member 29b such as an air cylinder mounted on the original chuck base 30 and which supports hemispherical pressing pins 26c and 26d for pressing a side edge of the original frame 21 in the Y direction. The pressing pins 26a and 26b of the X-direction pressing member 20a are disposed at positions which are opposed to the supporting pins 25a and 25b of the supporting member 19a with the original frame 21 interposed therebetween. The pressing pins 26c and 26d of the Y-direction pressing member 20b are disposed at positions which are opposed to the supporting pins 25c and 25d of the supporting member 19b with the original frame 21 interposed therebetween. With this structure, a pressing force can be applied toward the supporting pins 25a and 25b by the pressurizing member 29a and through the pressing pins 26a and 26b of the pressing member 20a, by which the original frame 21 can be positioned with respect to the X direction. Similarly, a pressing force can be applied toward the supporting pins 25c and 25d by the pressurizing member 29b and through the pressing pins 26c and 26d of the pressing member 20b, by which the original frame 21 can be positioned with respect to the Y direction.

When the positioning of an original is accomplished by pressing the side edges of the original frame 21 through the pressing pins 26a–26d, and if any imbalance between driving forces of the pressing members 20a and 20b produces a rotational moment in the original 4, the X-direction supporting member 19a can be rotationally moved by a small amount about the Z axis. This effectively reduces distortion of the original due to over-confinement by the four supporting pins 25a–25d.

In the manner described above, positioning of the original with respect to the X and Y directions and about the Z axis is accomplished by use of the supporting means 19, including supporting members 19a and 19b with supporting pins 25a–25d, and the pressing means 20, including pressing members 20a and 20b with pressing pins 26a–26d.

Z clamping means (40a, 40b and 40c) for accomplishing positioning with respect to the Z direction, comprises three clamping mechanisms 40a, 40b and 40c which can be driven by means of actuators (not shown) having rotational motion and straight motion mechanisms. The Z clamping means further comprises three hemispherical rigid ball members (not shown) which are disposed at positions opposed to the clamping mechanisms 40a, 40b and 40c, respectively, to sandwich the original frame 21 therebetween for positioning of the original 4. The Z clamping means should be disposed at a position not interfering with the supporting means and the pressing means for X-direction and Y-direction positioning or with a magnification correcting mechanism to be described later. The original frame 21 is positioned with respect to the Z direction as the same is pressed by the Z clamping means toward the original chuck base 30. Simultaneously therewith, the positioning thereof about the X and Y axes is performed. Since the Z-direction positioning is accomplished at three points by the Z clamping means as described above, an original can be held without flatness correction which may cause deformation along the surface. Also, the structure effectively reduces the possibility of deformation of an original due to any foreign particle caught between the original and the original chuck.

Figure 4A:
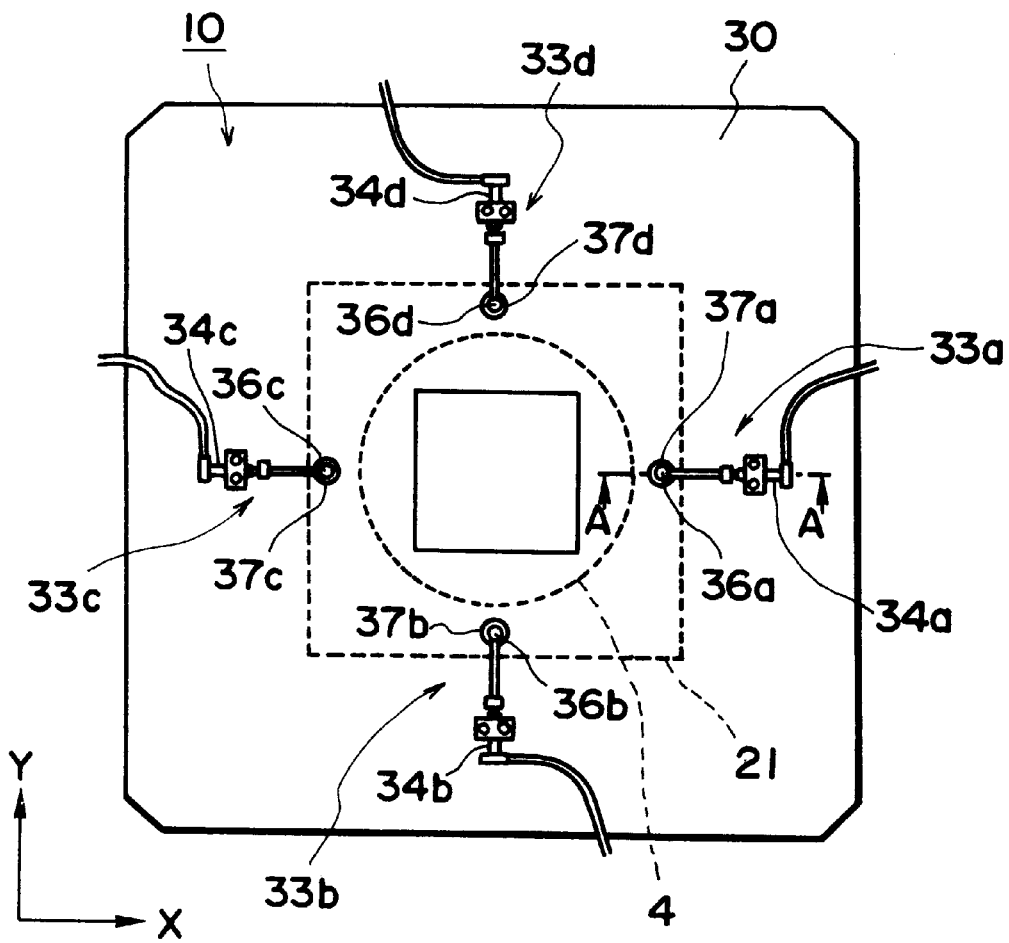
Figure 4B:
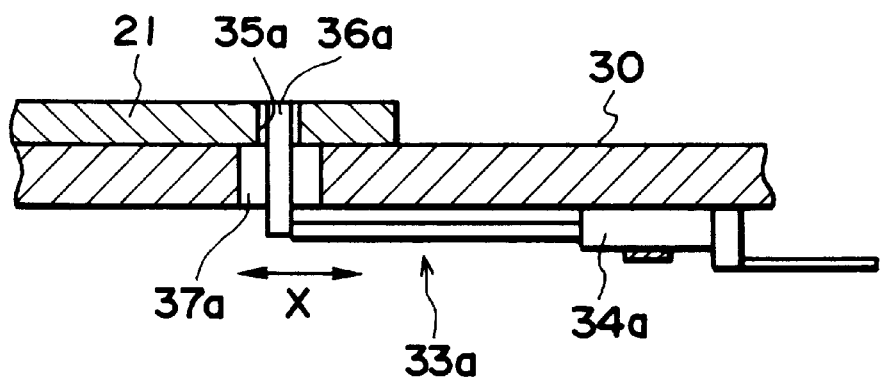

An example of a specific structure of magnification correcting mechanism 10 will now be described with reference to FIGS. 4A and 4B. Mounted on the bottom face of the original chuck base 30 are a pair of magnification correcting members 33a and 33c which are disposed opposed to each other in the X direction. Also, there are a pair of magnification correcting members 33b and 33d which are disposed opposed to each other in the Y direction. These magnification correcting members 33a–33d have the same mechanism, and only the magnification correcting member 33a disposed in the X direction will be explained. The magnification correcting member 33a includes a correcting pin 36a and an air cylinder 34a. The correcting pin 36a is inserted into throughbores 35a and 37a which are formed in the original chuck base 30 and the original frame 21, being attached to one side of the original chuck base 30, respectively, and which are registered with each other. The air cylinder 34a operates to drive the correcting pin 36a, through a rod, to move the same forwardly or backwardly along the X direction. The air cylinder 34a is mounted on the bottom face of the original chuck base 30, and its pressure is controlled in accordance with a specified value in the correction table of the correcting means 13 and the magnification correction controller 11. The throughbore 35a of the original frame 21 is formed with a size smaller than that of the throughbore 37a of the original chuck base 30. With this structure, by changing the pressure of the air cylinder 34a, the correction pin 36a is moved through the rod in the X direction within the throughbore 37a, such that the side face of the correcting pin 36a pushes or pulls the inside face of the throughbore 35a of the original frame 21 in the X direction. Thus, by controlling the pressure of the air cylinder 34a of the magnification correcting member 33a, a compressing force or a tension force can be applied to the original 4 independently in the X direction, through the correcting pin 36a. The remaining magnification correcting members 33b, 33c and 33d have similar structures. Thus, by controlling pressures of air cylinders 34a–34d in accordance with specified values of the correction table of the correcting means 13 and the magnification correction controller 11, a compressing force or a tension force can be applied to the original in the X and Y directions, independently, thereby to change the magnification of the original 4 so that it is suited to the magnification of the substrate. As described, the magnification correcting mechanism 10 of the present invention is operable to change the transfer magnification during exposure of one shot, in accordance with a specified value of the correction table of the correcting means 13 and the magnification correction controller 11. For example, during exposure of a shot, the substrate may be enlarged about the shot center O (FIG. 13C) due to thermal expansion. On that occasion, the magnification correction may be controlled as described above, by which changes of magnification, in X and Y directions, about the shot center O of the substrate produced by thermal expansion of the substrate can be reduced approximately to zero.

As regards magnification correction for an original such as a mask, while magnification correction based on thermal means is known, response of the magnification correction using thermal means is not good and a long time is necessary for the magnification correction. This leads to a reduction of throughput and to decreased productivity. In consideration of this, the present embodiment uses mechanical means such as described above.

Figure 5:
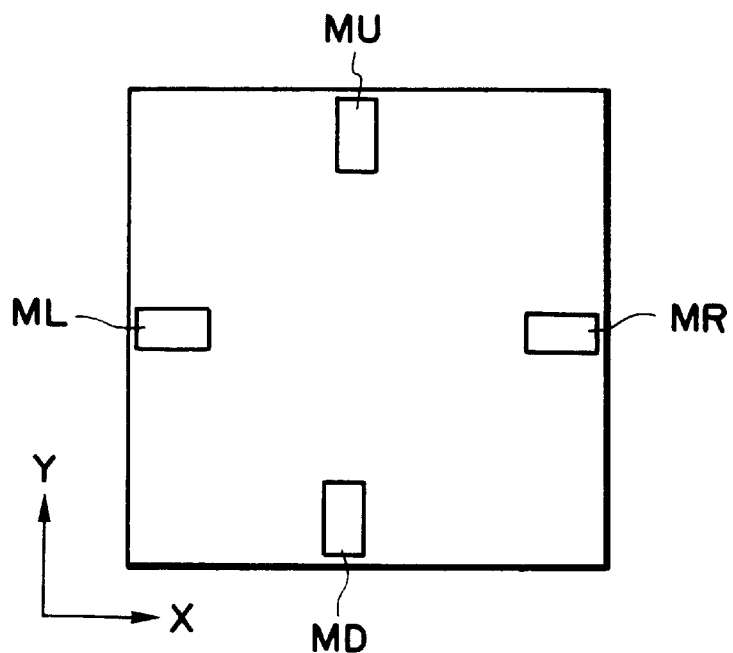
FIG. 5 is a top plan view showing alignment patterns provided on an original and a substrate.

Next, the correction table of the correcting means 13 will be described. FIG. 5 shows alignment patterns formed on an original and a substrate, which are used for obtaining a correction table through experiments. There are longitudinal (Y-direction) positional deviation measuring marks MU and MD at upper and lower portions of the exposure picture angle, and lateral (X-direction) positional deviation measuring marks ML and MR at left-hand and right-hand portions. For detection of the amount of positional deviation between alignment patterns of the original and the substrate, a method based on heterodyne interference, a method based on Fresnel zone plate diffraction light, or a method based on image processing, may be used.

Then, an original having substantially the same opening ratio as a printing original to be used for practical device manufacture is used. Before a start of exposure, the alignment patterns of the original and a substrate are brought into alignment with each other and, subsequently, exposures of shots of the substrate are made. Positional deviations of alignment patterns to be produced during the exposure are calculated as follows.

Figure 6:
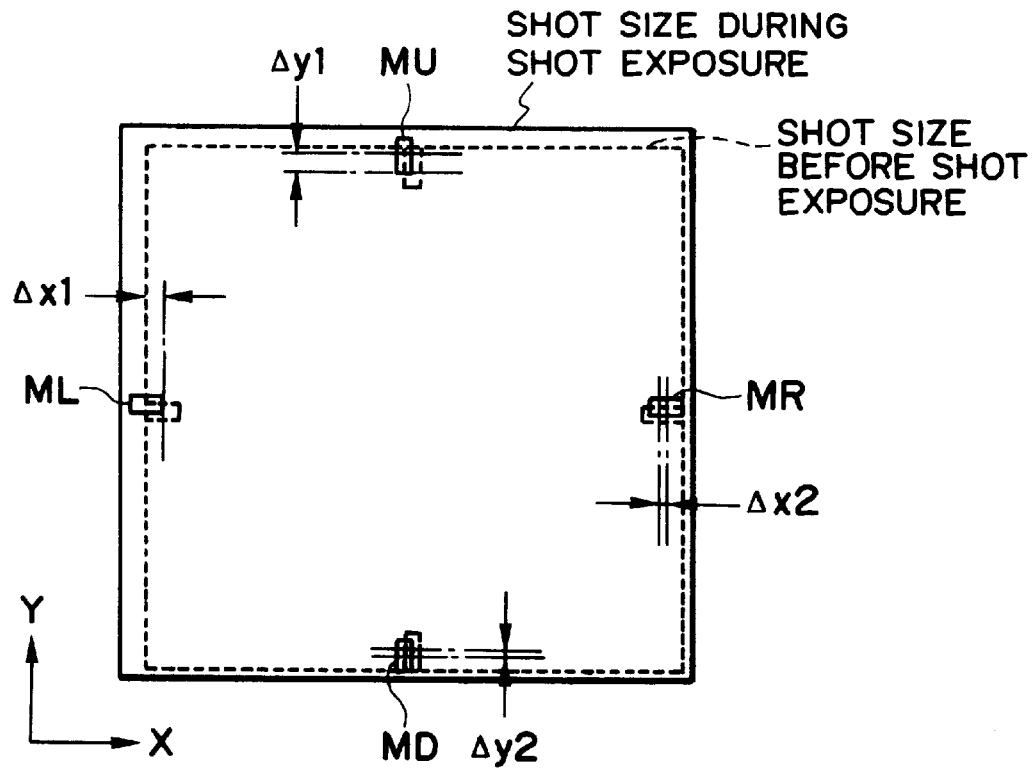
FIG. 6 is a schematic view for explaining the process of obtaining a correction table for correcting means of the present invention on the basis of experiments, and for explaining the state of deformation of a shot of a substrate and alignment patterns thereof due to the effect of thermal expansion during exposure of the shot.

FIG. 6 is an illustration for explaining the manner of obtaining a correction table of the correcting means by use of the alignment patterns shown in FIG. 5 and through experiments. An original and a substrate have alignment patterns MU, MD, ML and MR formed at corresponding positions. The size of a shot of the substrate before exposure of the shot as well as alignment patterns therefor are depicted by broken lines. The shot and alignment patterns as deformed by thermal expansion during exposure of the shot are depicted by solid lines. A design length between the X-direction marks ML and MR is Lx, and a design length between Y-direction marks MU and MD is Ly. What are to be detected here are shot translation direction offset (X, Y) of each shot, X-direction magnification Mx and Y-direction magnification My. It is now assumed that, based on measurement of alignment signals during the exposure, the X-direction movement amounts of the marks ML and MR are $\Delta x1$ and $\Delta x2$, respectively, while the Y-direction movement amounts of the marks MU and MD are $\Delta y1$ and $\Delta y2$, respectively. Then, the following signal processing is performed to calculate these values.

X translational direction offset: $X=(\Delta x1+\Delta x2)/2$

Y translational direction offset $Y=(\Delta y1+\Delta y2)/2$

X direction magnification: $Mx=(Lx+\Delta x1-\Delta x2)/Lx$

Y direction magnification: $My=(Ly+\Delta y1-\Delta y1)/Ly$

In a case where, from the symmetry of the pattern disposition of the original, the X-direction magnification My Mx and the Y-direction magnification may be considered to be substantially the same, the shot translational direction offset (X, Y) and X-Y magnification Mxy may be determined as follows. When it is detected from alignment signals that the mark ML has moved in the X direction by Δx1 and the mark MR has moved in the X direction by Δx2 and that the mark MU has moved in the Y direction by Δy1, like the preceding example, it can be calculated from below:

X translational direction offset: X=(Δx1+Δx2)/2

X-Y magnification: Mxy=(Lx+Δx1−Δx2)/Lx

Y translational direction offset:
Y=Δy1−(Lx×Mxy−Lx)/2

A larger number of marks may be used to remove the rotational component.

Figure 7:
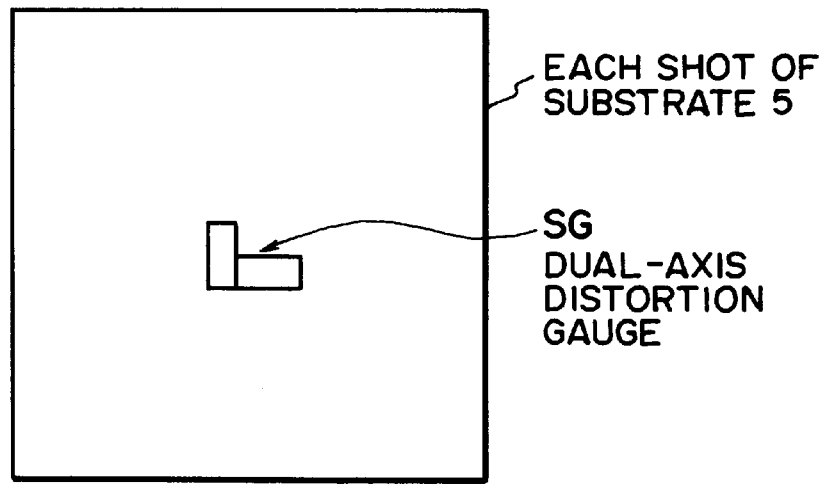
FIG. 7 is a schematic view for explaining another example of the process for obtaining a correction table for correcting means on the basis of experiments, and for explaining a case wherein a dual-axis distortion gauge is disposed approximately at the center of each shot of the substrate.

FIG. 7 shows a measurement pattern provided on a substrate, for detecting X-direction magnification Mx and Y-direction magnification My for the correction table of correcting means, beforehand, on the basis of another type of experiments. More specifically, a dual-axis distortion gauge SG with respect to the X and Y directions is defined substantially at the center of each shot of the substrate. The distortion gauge SG may be attached to the substrate surface, or it may be formed on the substrate through a thin film forming process. Alternatively, it may be attached to the substrate chuck. An original having substantially the same opening ratio as a printing original to be used for practical device manufacture is used, and exposures of shots on the substrate are performed. During exposure of each shot, values of distortion gauges SG provided in relation to these shots of the substrate are measured and, on the basis of this, X-direction distortion=X-direction magnification Mx, and Y-direction distortion=Y-direction magnification My can be calculated. Also, in a case where, from the symmetry of the pattern disposition on the substrate, the X-direction magnification Mx and the Y-direction magnification My can be regarded as being substantially the same, an X-Y single axis distortion gauge may be provided at the center of each shot and, by measuring values of distortion gauges being measured during exposures, distortion=X-Y magnification, that is, Mxy, may be detected.

Second Embodiment

In some exposure apparatuses using visible light or ultraviolet light such as an i-line exposure apparatus or a KrF excimer exposure apparatus wherein an original such as a mask has a high rigidity so that correcting the magnification by mechanically deforming the original is difficult to achieve, an optical element inside a projection optical system may be used for correction of transfer magnification. Before a start of exposure of a shot, the magnification of the substrate is calculated from the result having been obtained in accordance with a global alignment method, and, by moving the optical element in a direction outside the surface, the magnification is changed to meet the magnification of the substrate. Thereafter, exposure of the shot starts. Such optical element may be one by which, with movement thereof in a direction outside the surface, only the transfer magnification can be changed without changing the aberration.

Such an optical element of a projection optical system having the characteristic such as described above is used in this embodiment. Like the preceding embodiment, deformation due to thermal expansion of a substrate such as a wafer during exposure of one shot is calculated on the basis of exposure experiments or simulations. On the basis of the data thus obtained, the substrate stage for holding the substrate is moved in a direction along the surface to cancel the deformation of the substrate. Then, the optical element is moved in a direction outside the surface to change the transfer magnification. Correcting means having a correction table in which data for this is stored, is used to move, through a stage controller, the substrate stage in a direction along the surface during the exposure of the shot, by which translation of the shot center of the substrate due to thermal expansion by exposure is canceled. Also, during exposure of the shot, the optical element is moved in a direction outside the surface to change the magnification, by which enlargement of the substrate about the shot center is canceled.

Figure 8:
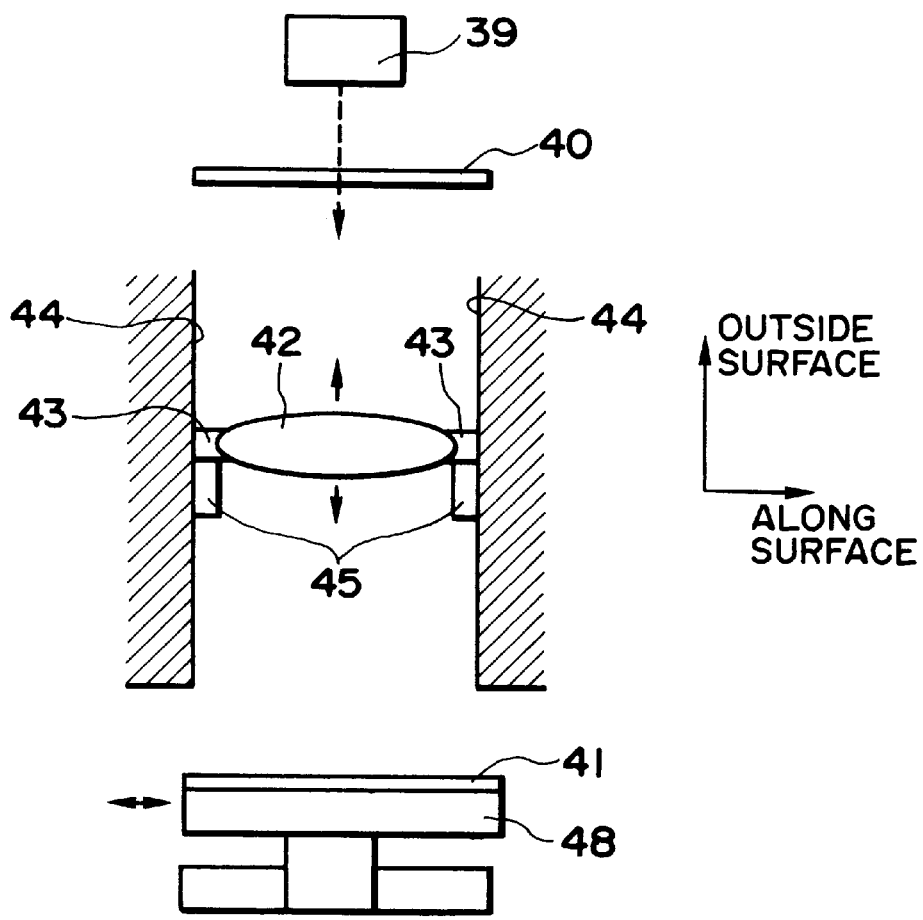
FIG. 8 is a schematic and sectional view for explaining an example wherein a magnification correcting mechanism uses an optical element in accordance with an exposure method of the present invention.

FIG. 8 shows an example of a specific structure. Denoted in the drawing at 39 is a light source, and denoted at 40 is a mask. Denoted at 41 is a substrate, and denoted at 48 is a substrate stage. A projection optical system for projecting a pattern of the mask 40 to the substrate 41 includes an optical element 42 which is mechanically joined to a cell 43 by fitting, for example, and the cell 43 is mounted on a guide 11, such that movement of the optical element 42 and the cell 43 in a direction along the surface is confined while movement of them in a direction outside the surface is allowed. The cell 43 can be urged outwardly from the surface by means of a piezoelectric device 45, attached to the cell 43, by which also the optical element 43 is urged outwardly from the surface, such that the exposure magnification is changed. During exposure of one shot, the transfer magnification of the optical element 42 is changed in accordance with the correction table of the correcting means 13 having been prepared beforehand, and, in addition thereto, the substrate stage 48 is moved. With this operation, like the preceding embodiment, magnification changes in X and Y directions around the shot center of the substrate, caused by thermal expansion of the substrate during exposure of one shot, can be reduced substantially to zero.

In accordance with the arrangement of the present invention as described hereinbefore, translation of the center of a shot of a substrate as well as enlargement about the shot center caused by thermal expansion during exposure of one shot can be corrected by relatively moving the original and the substrate and by actuating a transfer magnification correcting mechanism. Degradation of linewidth precision is thus reduced.

Also, even for an i-line exposure apparatus or a KrF excimer exposure apparatus wherein, due to high rigidity of an original, magnification correction by mechanically deforming the original is difficult to accomplish, an optical element (magnification element) may be used to correct translation of the shot center of a substrate as well as enlargement thereof about the shot center. This effectively reduces degradation of linewidth precision.

Third Embodiment

Next, an embodiment of a device manufacturing method which uses an exposure method such as described hereinbefore, will be explained.

Figure 9:
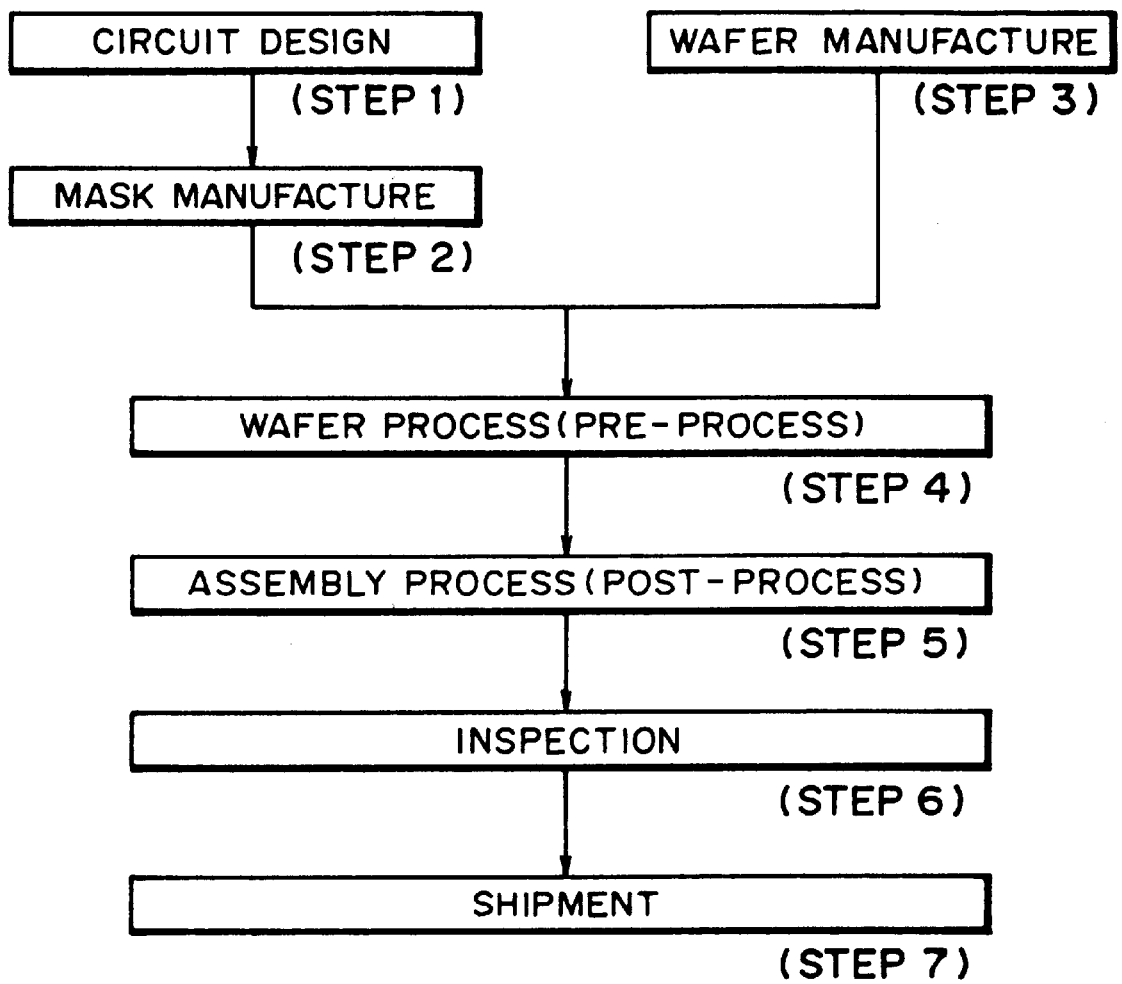
FIG. 9 is a flow chart for explaining semiconductor device manufacturing processes.

FIG. 9 is a flow chart of a procedure for the manufacture of microdevices such as semiconductor chips (e.g., ICs or LSIs), liquid crystal panels, CCDs, thin film magnetic heads or micro-machines, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes an assembling (dicing and bonding) process and a packaging (chip sealing)

process. Step 6 is an inspection step wherein an operation check, a durability check and so on for the semiconductor devices provided by step 5, are carried out. With these processes, semiconductor devices are completed and they are shipped (step 7).

Figure 10:
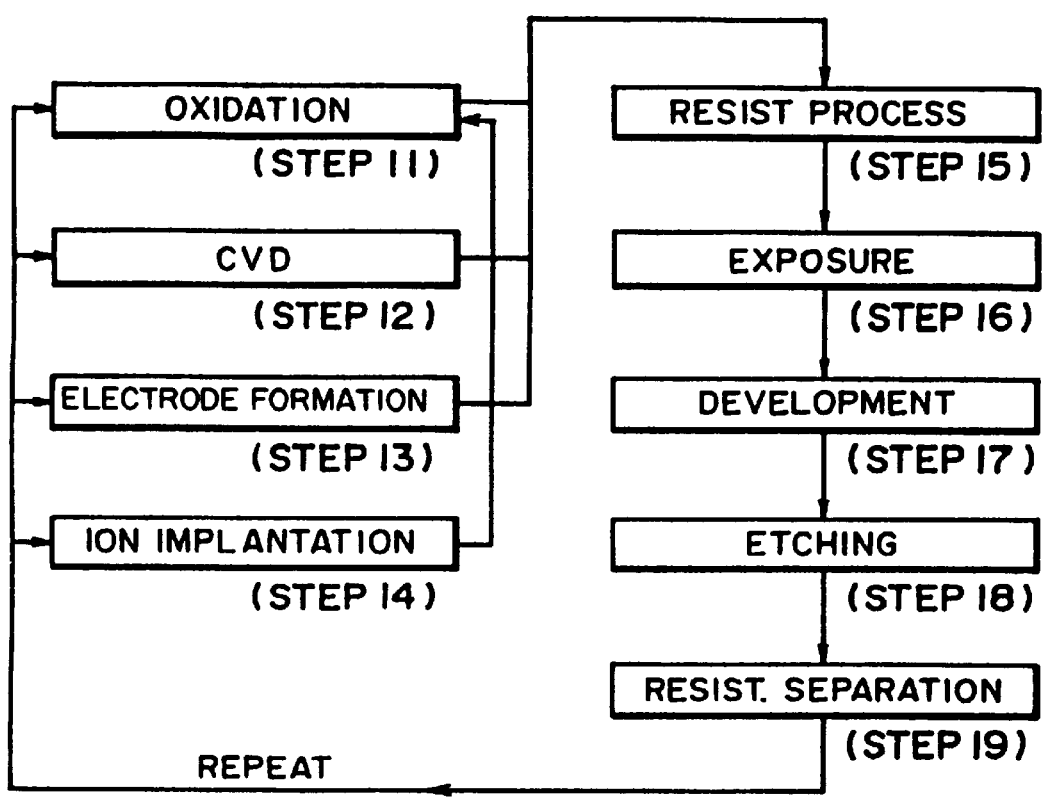
FIG. 10 is a flow chart for explaining details of a wafer process.
Figure 11A:
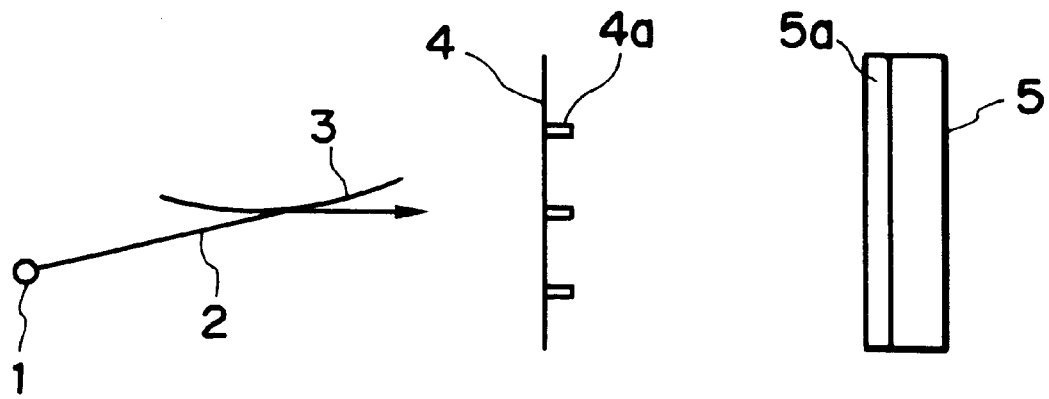
Figure 11B:
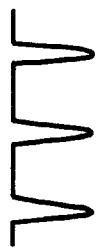
Figure 11C:
Figure 12A:
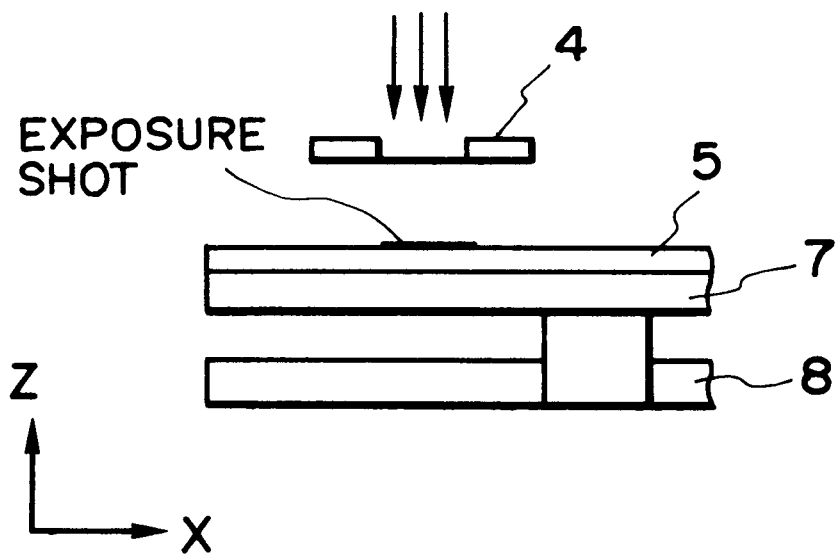
Figure 12B:
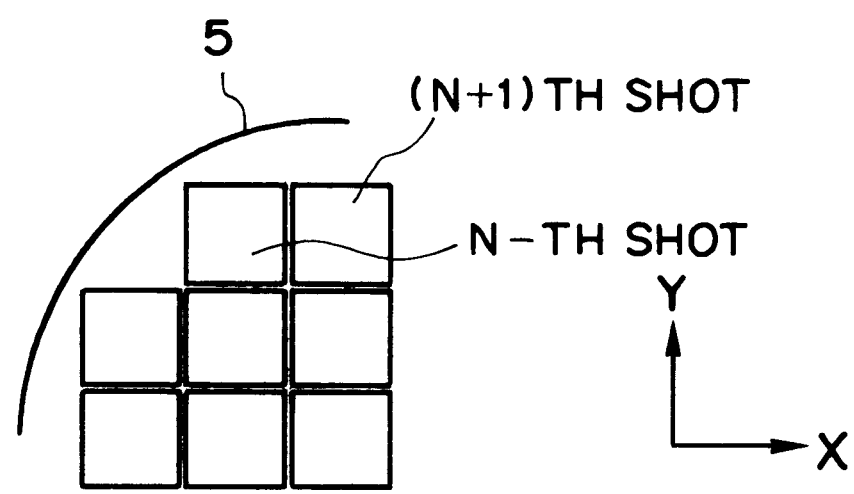

FIG. 10 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured with lower cost.

While the invention has been described with reference to the structures disclosed herein, it is not confined to the details set forth and this application is intended to cover such modifications or changes as may come within the purposes of the improvements or the scope of the following claims.

What is claimed is:

1. An exposure method, comprising the steps of:

transferring, by exposure, a pattern formed on an original to different shot regions on a substrate sequentially; and performing, during exposure of a certain shot, at least one of (i) adjusting a relative positional relation between the original and the substrate, with respect to a direction effective to correct translation of a transfer region of the substrate due to thermal distortion thereof, and (ii) adjusting a transfer magnification of the pattern of the original to the substrate so as to correct enlargement of the transfer region due to thermal distortion of the substrate.

2. A method according to claim 1, wherein said adjustment is made in accordance with a correction table related to thermal expansion of the substrate during exposure and being prepared on the basis of one of a calculation and a preparatory exposure experiment.

3. A method according to claim 2, wherein the transfer magnification is adjusted by deforming the original.

4. A method according to claim 1, wherein the transfer magnification is adjusted by adjusting a projection optical system for projecting the pattern of the original to the substrate.

5. A method according to claim 1, wherein the exposure uses exposure light which comprises one of X-rays, ultraviolet rays and visible light.

6. A device manufacturing method, comprising the steps of:

preparing a substrate;

applying a resist to the substrate prior to exposure thereof;

transferring, by exposure, a pattern of an original to the substrate in accordance with an exposure method as recited in claim 1; and developing the resist of the substrate after the exposure.

* * * * *

UNITED STATES PATENT AND TRADEMARK OFFICE
CERTIFICATE OF CORRECTION

PATENT NO. : 6,087,053
DATED : July 11, 2000
INVENTOR(S) : SHINICHI HARA

It is certified that error appears in the above-identified patent and that said Letters Patent is hereby corrected as shown below:

COLUMN 2:
  Line 67, "that;" should read --that--.

COLUMN 9:
  Line 51, "optical" should read --an optical--.

COLUMN 10:
  Line 27, "X" should read --the X--.
  Line 46, "of" should read --of the--.

Signed and Sealed this

Seventeenth Day of April, 2001

Attest:

NICHOLAS P. GODICI

Attesting Officer     *Acting Director of the United States Patent and Trademark Office*